United States Patent
Mizota

(10) Patent No.: US 10,500,617 B2
(45) Date of Patent: Dec. 10, 2019

(54) SUBSTRATE LIQUID TREATMENT APPARATUS, TANK CLEANING METHOD AND NON-TRANSITORY STORAGE MEDIUM

(71) Applicant: Tokyo Electron Limited, Tokyo (JP)

(72) Inventor: Shogo Mizota, Hsin-Chu (TW)

(73) Assignee: Tokyo Electron Limited, Minato-Ku (JP)

( * ) Notice: Subject to any disclaimer, the term of this patent is extended or adjusted under 35 U.S.C. 154(b) by 170 days.

(21) Appl. No.: 15/597,195

(22) Filed: May 17, 2017

(65) Prior Publication Data

US 2017/0333958 A1    Nov. 23, 2017

(30) Foreign Application Priority Data

May 17, 2016    (JP) .................................. 2016-098977

(51) Int. Cl.
*B08B 9/032*    (2006.01)
*H01L 21/67*    (2006.01)
*B08B 9/093*    (2006.01)

(52) U.S. Cl.
CPC ...... *B08B 9/0325* (2013.01); *H01L 21/67017* (2013.01); *H01L 21/67051* (2013.01); *B08B 9/093* (2013.01); *H01L 21/67023* (2013.01)

(58) Field of Classification Search
CPC . B08B 9/0813; B08B 9/093; H01L 21/67017; H01L 21/67023; H01L 21/67051; B24B 57/02
See application file for complete search history.

(56) References Cited

U.S. PATENT DOCUMENTS

| | | | | |
|---|---|---|---|---|
| 6,457,852 B1* | 10/2002 | Hiraoka | .................. | B01F 3/088 366/136 |
| 8,574,143 B2* | 11/2013 | Astheimer | .............. | B04B 15/06 494/26 |
| 2013/0220478 A1* | 8/2013 | Kasahara | .......... | H01L 21/67017 141/2 |
| 2015/0328668 A1 | 11/2015 | Koyama et al. | | |

FOREIGN PATENT DOCUMENTS

| JP | 2003-057843 A1 | 2/2003 |
|---|---|---|
| JP | 2015-220318 A1 | 12/2015 |

OTHER PUBLICATIONS

Japanese Office Action (Application No. 2016-098977) dated Jul. 12, 2019 (with English translation).

* cited by examiner

*Primary Examiner* — Terry K Cecil
(74) *Attorney, Agent, or Firm* — Burr & Brown, PLLC

(57) ABSTRACT

In one embodiment, a substrate liquid treatment apparatus includes: a tank that stores a processing liquid; a circulation line connected to the tank, through which circulation line a circulation flow of the processing liquid that leaves the tank and then returns back to the tank; a processing unit that processes a substrate by supplying the processing liquid, distributed from the circulation line, to the substrate; a return line that returns, to the tank, the processing liquid discharged from the processing unit after being supplied to the substrate; a cleaning nozzle that discharges a cleaning liquid onto an inner wall surface of the tank to clean the inner wall surface by the cleaning liquid; and a cleaning line that supplies the cleaning liquid to the cleaning nozzle.

8 Claims, 8 Drawing Sheets

SUBSTRATE LIQUID TREATMENT APPARATUS, TANK CLEANING METHOD AND NON-TRANSITORY STORAGE MEDIUM

CROSS-REFERENCE TO RELATED APPLICATIONS

This application is based upon and claims the benefit of priority from Japanese Patent Application No. 2016-098977, filed on May 17, 2016, the entire contents of which are incorporated herein by reference.

FIELD OF THE INVENTION

The present invention relates to a technique of cleaning a tank that constitutes a processing liquid supply unit in a substrate liquid treatment apparatus.

BACKGROUND ART

In the manufacture of semiconductor devices, a substrate such as a semiconductor wafer is subjected to a liquid treatment such as a wet cleaning process, a wet etching process and so on. In a substrate liquid treatment apparatus that performs such liquid treatments, in order to facilitate supplying of a chemical liquid of a stable concentration and a stable temperature to a substrate, there is provided a processing liquid supply unit including a tank that stores a processing liquid, a circulation line connected to the tank, and a plurality of branch lines branched from the circulation line. A processing liquid is supplied to a plurality of processing units through the respective branch lines. The used processing liquid, which has been once supplied to a substrate in each processing unit, is returned to the tank through a recovery line, and is then fed to the circulation line so as to be used again for processing another substrate (see JP2015-220318A, for example).

The used processing liquid having been returned to the tank contains particles. The tank is contaminated if the particles adhere to an inner wall surface of the tank.

SUMMARY OF THE INVENTION

The object of the present invention is to provide, in a substrate liquid treatment apparatus, a technique that enables cleaning of an inner wall of a tank to which a used processing liquid having been supplied to a substrate is returned.

In one embodiment of the present invention, there is provided a substrate liquid treatment apparatus comprising: a tank that stores a processing liquid; a circulation line connected to the tank, through which circulation line a circulation flow of the processing liquid that leaves the tank and then returns back to the tank flows; a processing unit that processes a substrate by supplying the processing liquid, distributed from the circulation line, to the substrate; a return line that returns, to the tank, the processing liquid discharged from the processing unit after being supplied to the substrate; a cleaning nozzle that discharges a cleaning liquid onto an inner wall surface of the tank to clean the inner wall surface by the cleaning liquid; and a cleaning line that supplies the cleaning liquid to the cleaning nozzle.

In another embodiment of the present invention, there is provided a tank cleaning method executed in a substrate liquid treatment apparatus, said apparatus including a tank that stores a processing liquid, a circulation line connected to the tank, through which circulation line a circulation flow of the processing liquid that leaves the tank and then returns back to the tank, a processing unit that processes a substrate by supplying the processing liquid, distributed from the circulation line, to the substrate, a return line that returns, to the tank, the processing liquid discharged from the processing unit after being supplied to the substrate, said method comprising: discharging a cleaning liquid from a nozzle disposed in a tank onto an inner wall surface of the tank, thereby cleaning the inner wall surface by the cleaning liquid.

In yet another embodiment of the present invention, there is provided a non-transitory storage medium storing a computer program, wherein upon execution of the program by a computer for controlling operations of the substrate liquid treatment apparatus, the computer controls the substrate liquid treatment apparatus to perform the aforementioned tank cleaning method.

According to the foregoing embodiments of the present invention, since the tank is cleaned by discharging the cleaning liquid from the cleaning nozzle onto the inner wall surface of the tank, the inner wall surface of the tank can be efficiently cleaned.

DESCRIPTION OF EMBODIMENTS

Figure 1:
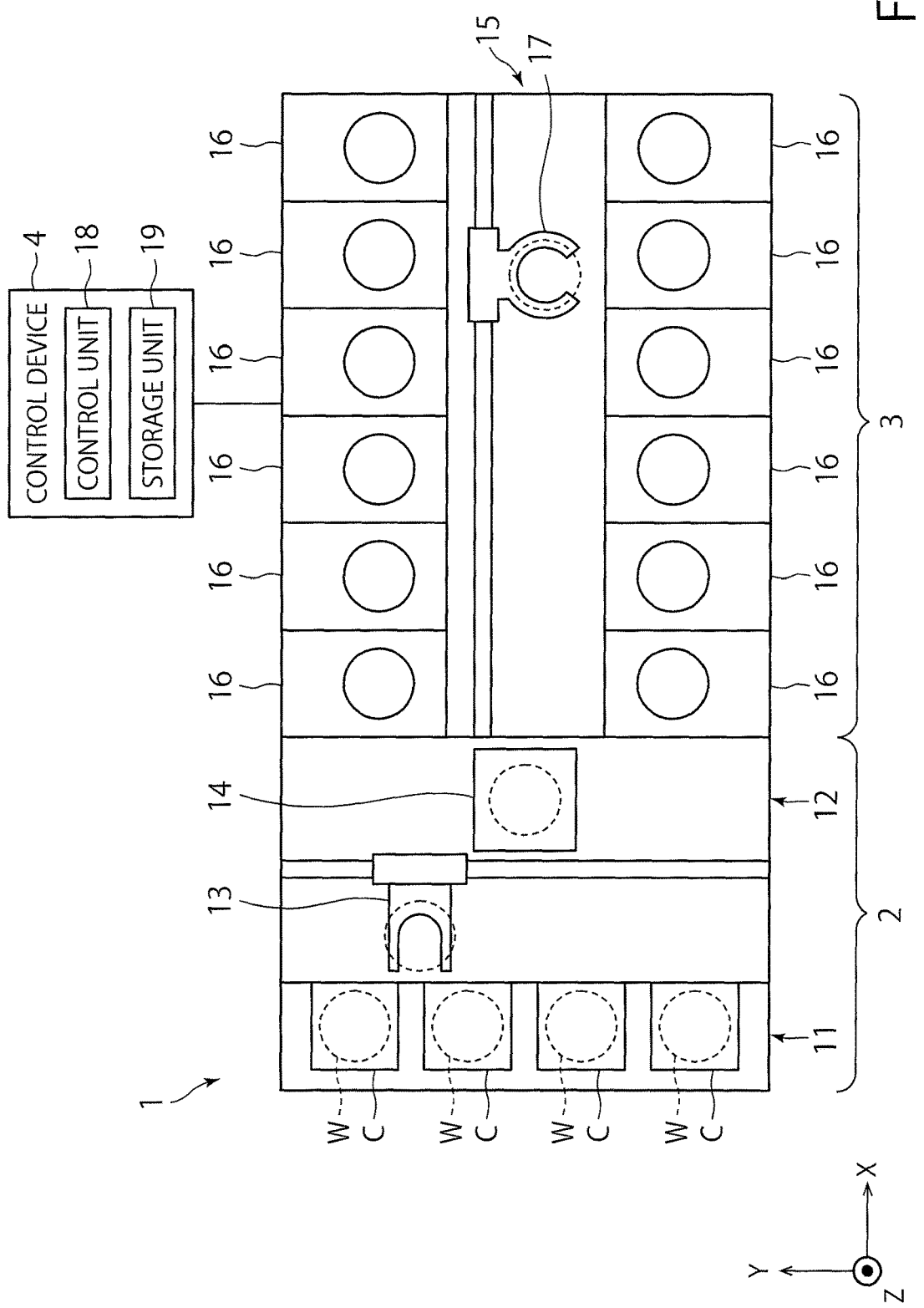
FIG. 1 is a plan view showing a schematic structure of a substrate processing system according to one embodiment of the present invention.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processing procedures performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
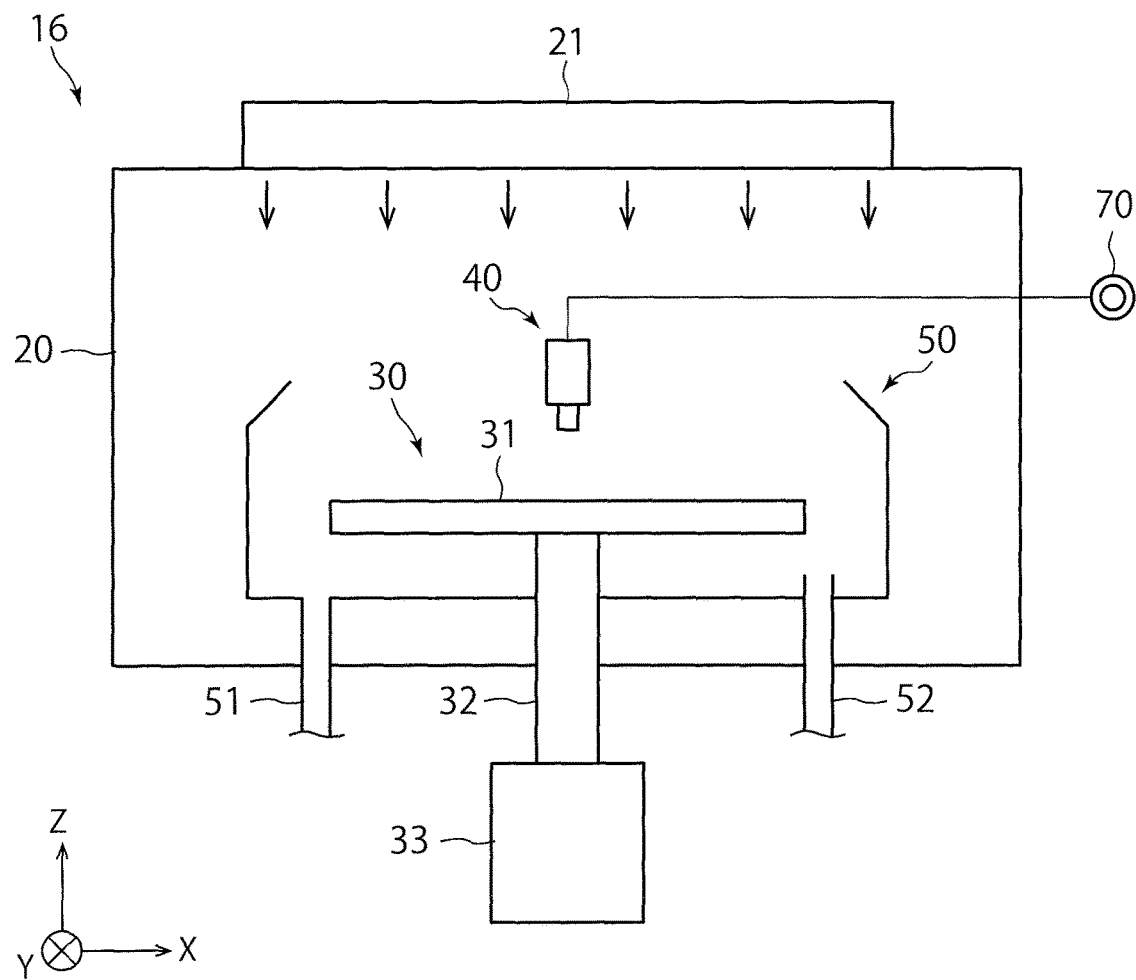
FIG. 2 is a vertical sectional view showing a schematic structure of a processing unit included in the substrate processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
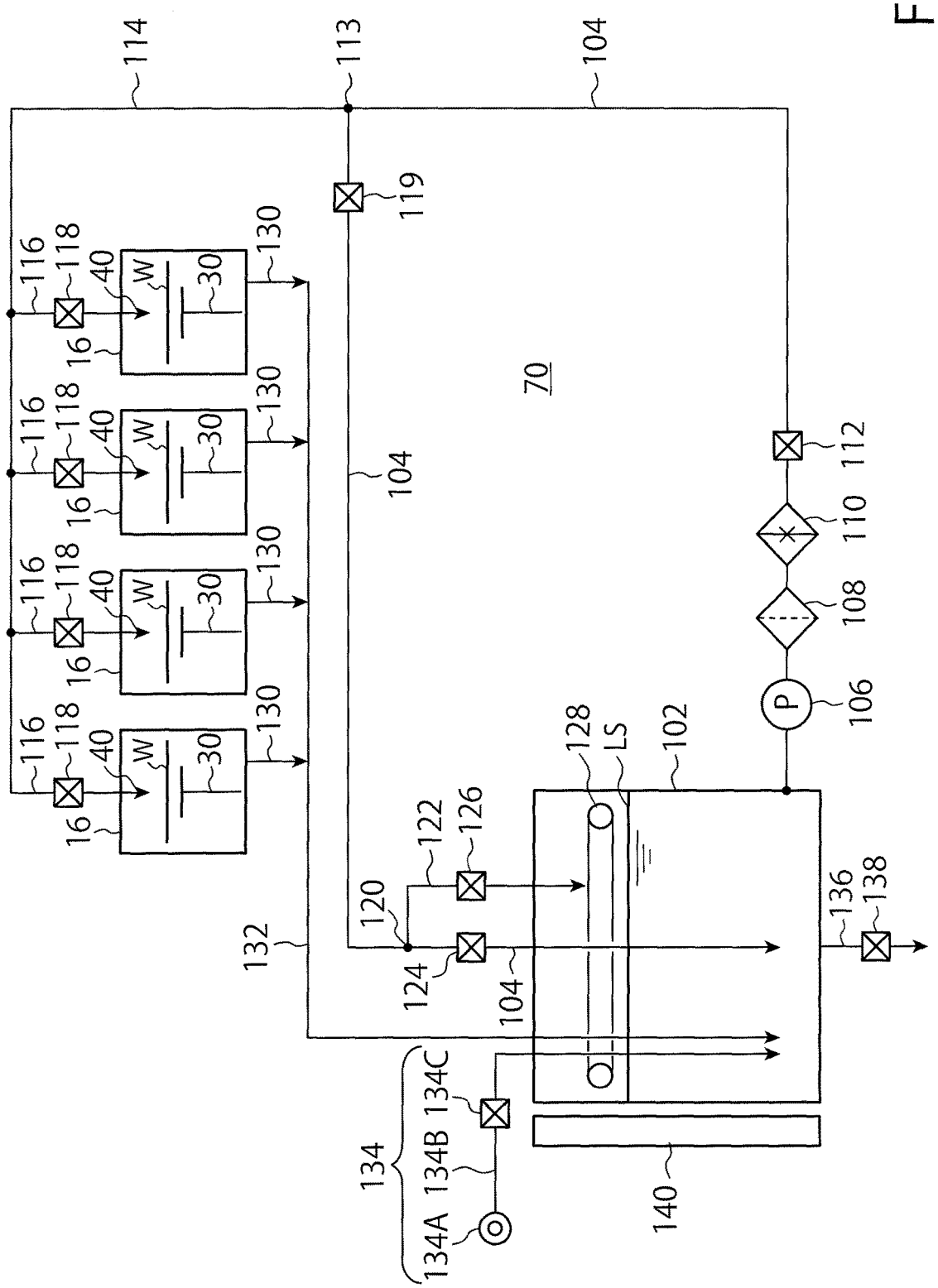
FIG. 3 is a piping diagram showing a structure of a processing liquid source (processing liquid supply mechanism) that supplies a processing liquid to the processing unit.

The processing fluid source 70 (i.e., processing fluid supply mechanism) is described with reference to FIG. 3.

The processing fluid source 70 includes a tank 102 that stores a processing liquid, and a circulation line 104 that runs out from the tank 102 and returns back to the tank 102. In this embodiment, the tank 102 has a substantially rectangular parallelepiped shape. The circulation line 104 is provided with a pump 106. The pump 106 forms a circulation flow of a processing liquid that leaves the tank 102 and then returns back to the tank 102 through the circulation line 104. The upstream end of a pipe defining the circulation line 104 is connected to a lowermost portion of a side surface of the tank 102. The downstream end of the pipe defining the circulation line 104 is located in the tank 102, at a level lower than the minimum value of the height (level) of the liquid surface LS (i.e., the lowest level) of the processing liquid present in the tank 102 in usual operation.

The circulation line 104 is provided, downstream of the pump 106, with a filter 108 for removing contaminants such as particles that may be contained in the processing liquid, a heater 110 for heating the processing liquid, and a shutoff valve 112, in this order from the upstream side.

A distribution line 114 is branched from the circulation line 104 at a branch point 113 that is located downstream of the shutoff valve 112. The distribution line 114 branches into a plurality of branched distribution lines 116. Each of the branched distribution lines 116 supplies the processing liquid to a nozzle (it corresponds to the processing fluid supply unit 40 in FIG. 2.) of respective one of processing units 16. A flow control equipment 118, such as a shutoff valve and a flow rate control valve, is disposed on each branched distribution line 116. By supplying a wafer W held by the substrate holding mechanism 30 with the processing liquid from the processing liquid supply nozzle (processing fluid supply unit 40) at a flow rate controlled by the flow controller 118, the wafer W can be subjected to a liquid treatment.

A constant pressure valve 119 is disposed on the circulation line 104 at a location downstream of the branch point 113. The constant pressure valve 119 has a pressure regulating function for maintaining the primary side pressure of constant pressure valve 119 constant, by adjusting its opening degree. The constant pressure valve 119 maintains substantially constant the pressure in the distribution line 114, which may vary depending on variation of the total flow rate of the processing liquid to be supplied to the plurality of processing units 16, so that the processing liquid can be discharged at a stable flow rate from the processing liquid supply nozzle (processing fluid supply unit 40).

When the number of processing units 16 that are supplying the processing liquid to wafers W increases, the opening degree of the constant pressure valve 119 decreases in order to maintain the primary side pressure high. At this time, a valve element and a valve seat of the constant pressure valve 119 may come into contact with each other, resulting in generation of particles. In order to prevent the generation of particles, when the number of the processing units 16 that are supplying the processing liquid to wafers W (or the total flow rate of the processing liquid flowing through the distribution line 114) exceeds a predetermined threshold value, the operation of the pump 106 may be controlled such that a driving pressure of the pump 106 is increased.

A cleaning line 122 is branched from the circulation line 104 at a branch point 120 set in a downstream portion of the circulation line 104. A shutoff valve 124 is disposed on the circulation line 104 at a location downstream of the branch point 120, and also a shutoff valve 126 is disposed on the cleaning line 122 at a location downstream of the branch point 120. A cleaning nozzle 128 for cleaning an inner wall surface of the tank 102 is attached to the downstream end of the cleaning line 122. The cleaning nozzle 128 is located at a level higher than a predetermined target level of the liquid surface LS of the processing liquid in the tank 102 (corresponding to L1 in FIG. 6 described later).

A liquid discharging line 130 is connected to each processing unit 16. A plurality of the liquid discharging lines 130 are connected to a single return line 132. The return line 132 is connected to the tank 102. Due to this structure, the used processing liquid, which has been supplied from the nozzle (processing fluid supply unit 40) to a wafer W and then left the wafer W, can be returned to the tank 102 through the liquid discharging line 130 and the return line 132. The downstream end of a pipe defining the return line 132 is located in the tank 102 at a level lower than the liquid level of the processing liquid present in the tank 102 in usual operation.

The tank 102 is provided with a processing liquid replenishing unit 134 that replenishes the processing liquid or components constituting the processing liquid, such that a level of the processing liquid in the tank 102 becomes a target predetermined level. The processing liquid replenishing unit 134 includes a replenishing processing liquid supply line 134B connected to a replenishing processing liquid source 134A, and a shutoff valve 134C disposed on the replenishing processing liquid supply line 134B. The downstream end of a pipe defining the replenishing processing liquid supply line 134B is located in the tank 102 at a level lower than the liquid level of the processing liquid present in the tank 102 in usual operation.

A drain line 136 for discarding the processing liquid in the tank 102 is connected to a bottom of the tank 102. A shutoff valve 138 is disposed on the drain line 136. The tank 102 is provided with a liquid level sensor 140 for detecting the level of the liquid surface LS (liquid level) of the processing liquid in tank 102.

The top of the tank 102 is covered with a top plate. Pipes constituting the circulation line 104, the cleaning line 122, the return line 132 and the replenishing processing liquid supply line 134B pass through the top plate.

In a preferred embodiment, the cleaning nozzle 128 may be formed of at least one tubular body extending along the inner wall surface of the tank 102, which has a plurality of drilled openings serving as discharge ports.

Figure 4:
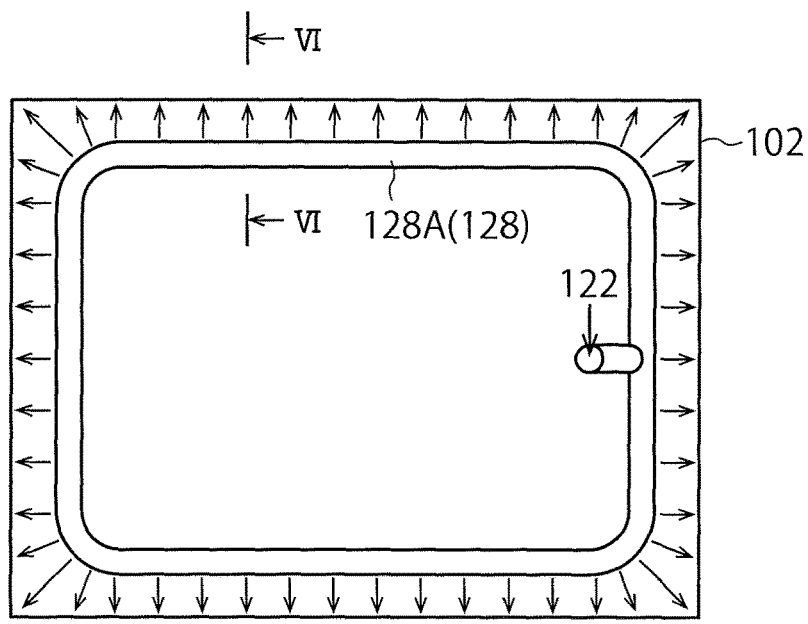
FIG. 4 is a schematic plan view showing an example of a cleaning nozzle arrangement in a tank included in the processing liquid source.

If the horizontal section of the tank 102 has a rectangular shape, as show in FIG. 4, for example, the cleaning nozzle 128 may be formed of one tubular body 128A that is bent into substantially a rectangular shape. In this case, a pipe, which vertically extends to pass through the top plate of the tank and constitutes the cleaning line 122, is connected to the tubular body 128A. The processing liquid is supplied from the plurality of openings (not shown in FIG. 4), which are formed in the tubular body 128A serving as discharge ports, onto the inner wall surface of the tank 102 (see arrows extending from the tubular body 128A toward the inner wall surface of the tank 102).

Figure 5:
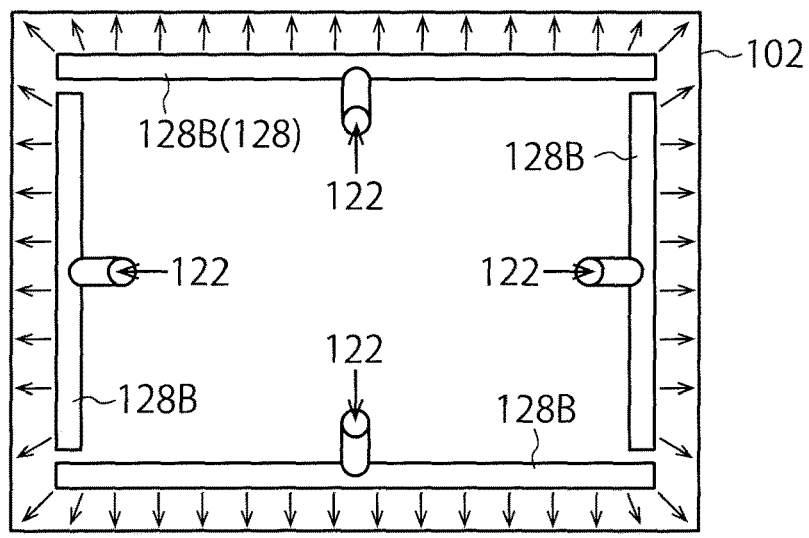
FIG. 5 is a schematic plan view showing another example of a leaning nozzle arrangement in the tank included in the processing liquid source.

Alternatively, as shown in FIG. 5, for example, the cleaning nozzle 128 may be composed of four tubular bodies 128B respectively corresponding to the four sides of the rectangle. In this case, a pipe defining the cleaning line 122 is branched into four pipes at the downstream end of the cleaning line 122, and the four pipes are connected to the respective one of four tubular bodies 128B. The processing liquid is supplied from a plurality of openings (not show in FIG. 5), which are formed in each tubular body 128B serving as discharge ports, onto the inner wall surface of the tank 102 (see arrows extending from the tubular bodies 128B toward the inner wall surface of the tank 102).

In general, contaminants such as particles float on the liquid surface of the processing liquid in the tank 102 and adhere to the inner wall surface of the tank 102. When the liquid surface of the processing liquid lowers at the exchanging of the processing liquid in the tank 102 for example, the contaminants such as particles remain adhering to the inner wall surface of the tank 102. The height position of the cleaning nozzle 128 and the orientation of each discharge port are set in order that a part to which the contaminants are likely to adhere can be reliably cleaned. This will be described with reference to FIG. 6.

Managing methods for managing the liquid level of the processing liquid in the tank 102 includes a management method (hereinafter referred to also as "first management method") in which the processing liquid replenishing unit 134 is feedback-controlled based on a detection value of the liquid level sensor 140 such that the liquid level (see the reference numeral LS in FIG. 3) is always located at a predetermined level. There is another management method (hereinafter referred to also as "second management method") in which, when the liquid level sensor 140 detects that the liquid level has lowered down to a lower limit level (chain lines L3 in FIG. 6), i.e., a replenishment start level, the processing liquid is replenished by the processing liquid replenishing unit 134 such that the level of the processing liquid becomes a predetermined target level (chain lines L1 in FIG. 6), i.e., a replenishment stop level. In the first management method, the liquid level varies within a relatively narrow range, for example, within a range between the chain lines L1 and the chain lines L2.

Figure 6:
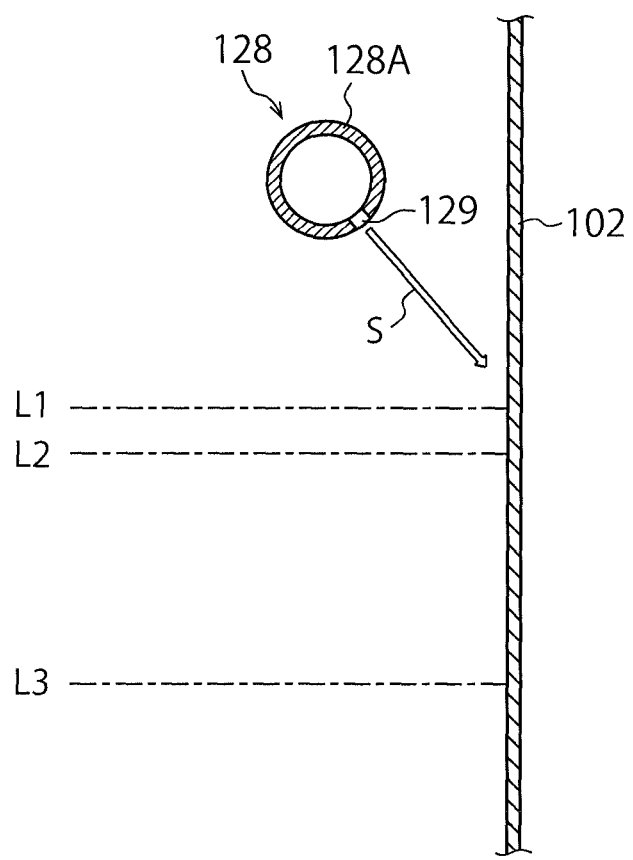
FIG. 6 is a schematic vertical sectional view of a part near an inner wall surface of the tank, taken along the line VI-VI in FIG. 4, for explaining the cleaning nozzle arrangement in the tank.

The range within which the contaminants adhere and the density of the adhering contaminants vary depending on the management method to be employed. However, in either case, most contaminants adhere to the inner wall surface of the tank 102 near a height position corresponding to a height possible level of the liquid surface. Thus, as shown in FIG. 6, the height position of the cleaning nozzle 128 and the orientation of the discharge ports 129 are preferably determined such that the processing liquid for cleaning discharged from the discharge ports 129 collides against a height position of the inner wall surface of the tank 102 that is substantially the same or higher than the predetermined target level (chain lines L1 in FIG. 6) that is the highest possible level of the liquid surface. In addition, the orientation of the discharge ports 129 is preferably determined such that the processing liquid for cleaning is discharged diagonally downward onto the inner wall surface of the tank 102 (see the blank arrow S in FIG. 6) such that the processing liquid for cleaning flows downward along the inner wall surface without splashing when it collides against the inner wall surface of the tank 102.

The cleaning nozzles 128 may be disposed at two different height positions. In this case, the cleaning nozzle 128 located at a lower position discharges the processing liquid onto a part near the level of the chain lines L1 on the inner wall surface of the tank 102 (the part to which the contaminants adhere at a highest density), and the cleaning nozzle located at a higher position discharges the processing liquid onto a yet higher part. Thus, the contaminants can be efficiently peeled off from the inner wall surface of the tank 102 by the collision energy of the processing liquid discharged from the lower cleaning nozzle. In addition, the peeled contaminants can be washed away downward by the processing liquid discharged from the higher cleaning nozzle.

Next, a method of cleaning the tank 102, which is performed when the processing liquid is exchanged, is described.

Suppose the below-described condition. The processing of wafers W of a certain process lot has just finished. The processing liquid in the tank 102 is deteriorated to an allowable limit or the content of contaminants reaches an allowable limit, so that the processing liquid has to be exchanged. The shutoff valve 124, which has been opened during the process of the wafers W, is maintained opened, and the shutoff valve 126, which has been closed during the process of the wafers W, is maintained closed. In addition, the pump 106, which has been operated during the process of the wafers W, is continuously operated. Thus, the processing liquid is circulating in the circulation line 104. Since none of the processing units 16 process wafers W, the shutoff valve included in the flow control equipment 118 is closed. Thus, no processing liquid flows from the circulation line 104 to the distribution line 114. In addition, there is substantially no processing liquid in the liquid discharge line 130 and the return line 132.

Starting from the above-described condition, the shutoff valve 138 of the drain line 136 is firstly opened to start draining of the processing liquid in the tank 102.

Substantially simultaneously with the starting of the draining of the processing liquid in the tank 102 (or slightly before or slightly after the starting of the draining of the processing liquid), the shutoff valve 124 of the circulation line 104 is closed and the shutoff valve 126 of the cleaning line 122 is opened, so that the processing liquid having flown into the branch point 120 of the circulation line 104 flows into the cleaning nozzle 128 through the cleaning line 122. Thus, the processing liquid is ejected from the cleaning nozzle 128 onto the inner wall surface of the tank 102, so that the contaminants adhering to the inner wall surface are cleaned off.

In accordance with progress of the draining of the processing liquid through the drain line 136, the liquid level of the processing liquid in the tank 102 lowers. When the liquid level of the processing liquid in the tank 102 becomes substantially the same or lower than the level at which the upstream end of the circulation line 104 connected to the tank 102, runaway of the pump 106 (which means the condition where the pump 106 operates with no or substantially no fluid entering into the fluid inlet) occurs. Immediately after the runaway of the pump 106 occurs, or after the liquid level sensor 140 detects that the liquid level has reached a level at which runaway may occur, the pump 106 is stopped. After that, the drain line 136 is continuously drained until the tank 102 becomes empty.

Throughout the period from the time point when the aforementioned cleaning procedure of the tank 102 is started to the time point when the pump 106 is stopped, the processing liquid is continuously ejected from the cleaning nozzle 128 onto the inner wall surface of the tank 102. Thus, the contaminants adhering to the inner wall surface of the tank 102 are cleaned off by the processing liquid ejected form the cleaning nozzle 128. Then, the contaminants flow downward along the inner wall surface of the tank 102 so as to flow into the processing liquid stored in the tank 102. A part of the contaminants having flown into the processing liquid stored in the tank 102 is discharged, together with the processing liquid, from the tank 102 through the drain line 136. Another part of the contaminants having flown into the processing liquid stored in the tank 102 flows out therefrom into the circulation line 104 so as to be trapped by the filter 108. Thus, the processing liquid cleaned by the filter 108 is supplied to the tank 102. In the manner as described above, the contaminants adhering to the inner wall surface of the tank 102 can be removed.

After the tank 102 has become empty, supplying of a new processing liquid from the processing liquid replenishing unit 134 into the tank 102 is started. Thereafter, the shutoff valve 138 of the drain line 136 is closed. When the liquid level in the tank 102 rises to a level that allows the pump 106 to operate without any trouble, the pump 106 is activated to circulate the processing liquid through the circulation line 104. Thus, the clean processing liquid circulates through the circulation line 104. As a result, wafers W now can be processed again in the processing units 16 with the use of the clean processing liquid.

If it is desired to further improve the cleanliness of the circulation line 104 and the devices in the circulation line 104, the same procedure as described above may be further performed once or more by using a new processing liquid.

In the aforementioned procedure, after the draining of the processing liquid through the drain line 136 has been started, the draining of the processing liquid through the drain line 136 is continuously carried out until the liquid level in the tank 102 becomes a liquid level at which the runaway of the pump 106 occurs. However, not limited thereto, the draining may be stopped for a while, at any timing before the liquid level of the processing liquid in the tank 102 becomes the liquid level at which the runaway of the pump 106 occurs. In this case, while the draining of the processing liquid through the drain line 136 is being stopped, the processing liquid flows sequentially through the tank 102, the circulation line 104 on the downstream side of the branch point 120, the cleaning line 122 and the cleaning nozzle 128, so as to clean the inner wall surface of the tank 102. After this condition has been maintained for a predetermined period of time, the draining of the processing liquid through the drain line 136 may be again started.

In the above-described embodiment, since the processing liquid is discharged from the cleaning nozzle 128 disposed in the tank 102 onto the inner wall surface of the tank 102, the contaminants adhering to the inner wall surface of the tank 102 can be efficiently removed.

In addition, in the above-described embodiment, since the inner wall surface of the tank 102 is cleaned with the use of the used processing liquid in the tank 102 and the circulation line 104, the cleaning can be performed at a lower cost as compared with a case in which an exclusive cleaning liquid is used. In addition, since the driving force for discharging the processing liquid from the cleaning nozzle 128 is generated by the pump 106 disposed on the circulation line 104, increase in equipment cost can be restrained as compared with a case in which the driving force for discharging the processing liquid from the cleaning nozzle 128 is generated by another pump. In addition, in general, contaminants adhering to the inner wall surface, which derive from the processing liquid (i.e., a substance of a wafer W removed therefrom by a chemical reaction with the processing liquid), can be efficiently eliminated by using the processing liquid from which the contaminants are derived.

Figure 10:
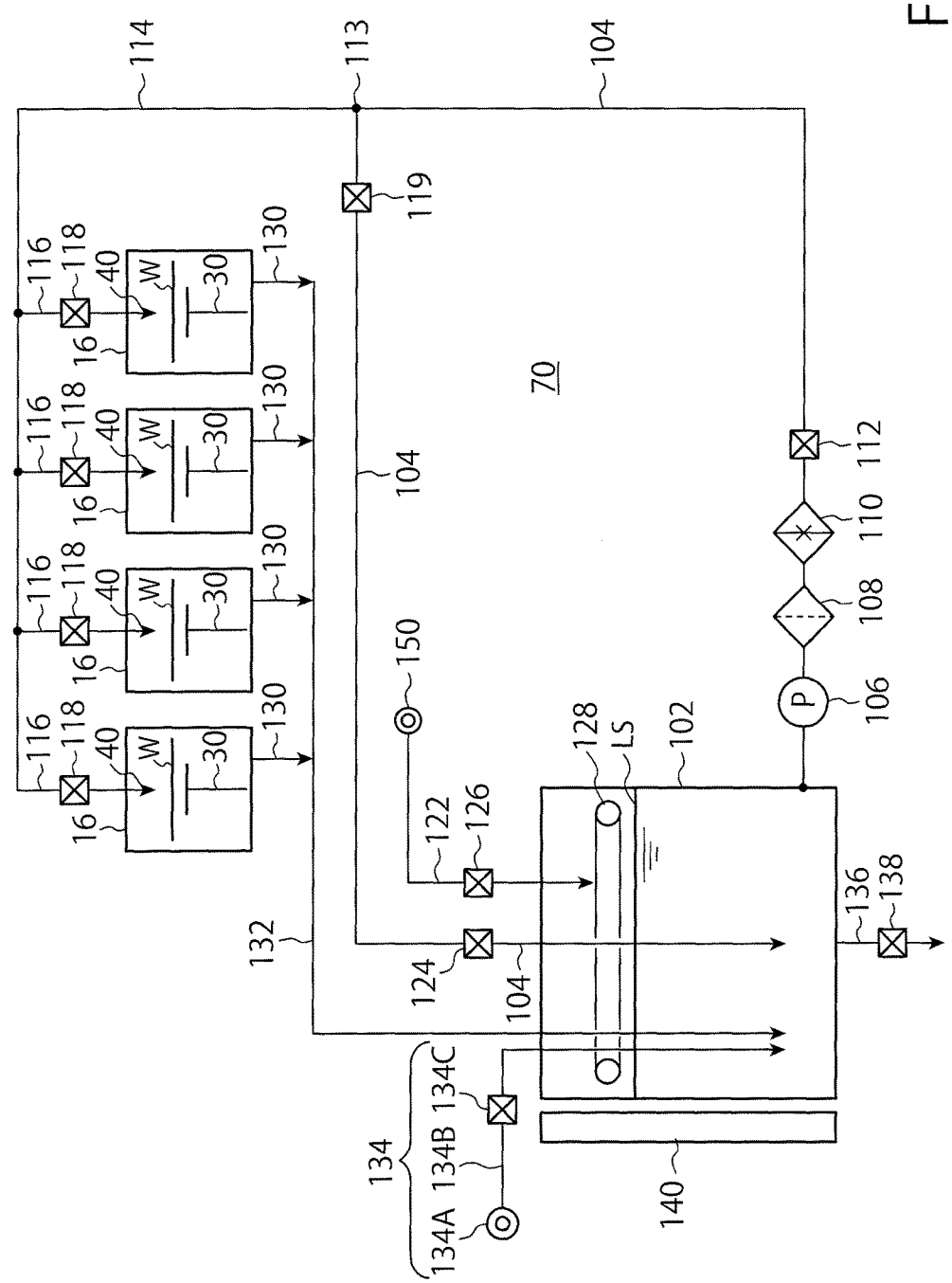
FIG. 10 is a piping diagram showing another structure of the processing liquid source (processing liquid supply mechanism).

The inner wall surface of the tank 102 can be cleaned by using an exclusive cleaning liquid. In this case, as shown in FIG. 10, the cleaning line 122 is not branched from the circulation line 104, but is provided independently from the circulation line 104. The upstream end of the cleaning line 122 is connected to a cleaning liquid source 150. In this case, since a cleaning liquid of a higher cleanliness degree free of particles can be used, the contaminants can be efficiently removed. In addition, since it is possible to use a cleaning liquid having a particularly high cleaning function for specific contaminants, the cleaning efficiency can be improved. Also in this case, the cleaning of the inner wall surface of the tank 102 can be performed while the processing liquid in the tank 102 is being discharged from the drain line 136 for the exchanging of the processing liquid in the tank 102. In a case where a cleaning liquid that causes an undesired reaction with the processing liquid in the tank 102 (to generate heat or harmful gas, etc.) is used, there may be performed a procedure including: discharging all the processing liquid in the tank 102; thereafter discharging deionized water from the cleaning nozzle 128 onto the inner wall surface of the tank 102, for example, so as to clean off the processing liquid from the inner wall surface of the tank 102; and thereafter discharging the cleaning liquid from the cleaning nozzle 128 onto the inner wall surface of the tank 102. By using the cleaning liquid different from the processing liquid, the cleaning procedure of the inner wall surface of the tank 102 can be flexibly changed.

The above-described embodiment can be modified as described below.

Figure 7:
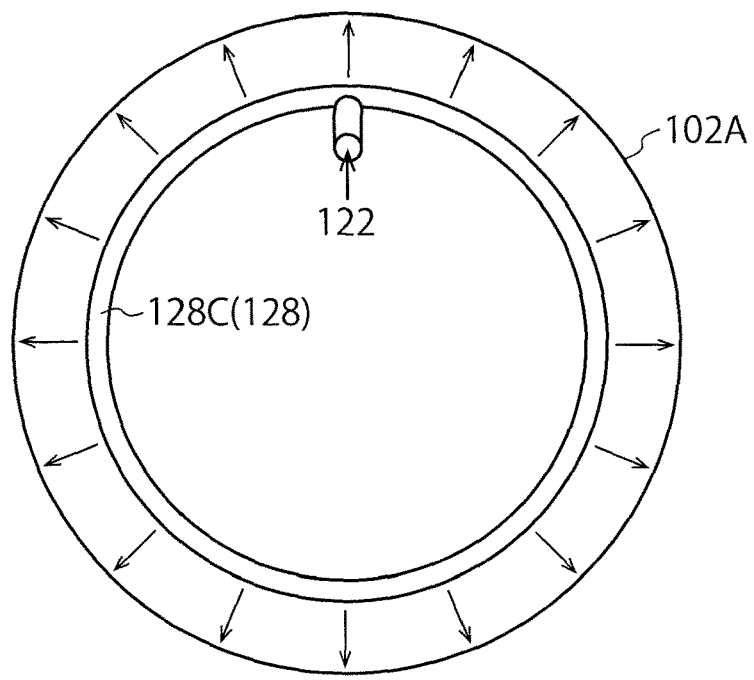
FIG. 7 is a schematic plan view showing an example of a cleaning nozzle arranged in a tank having a circular horizontal section.
Figure 8:
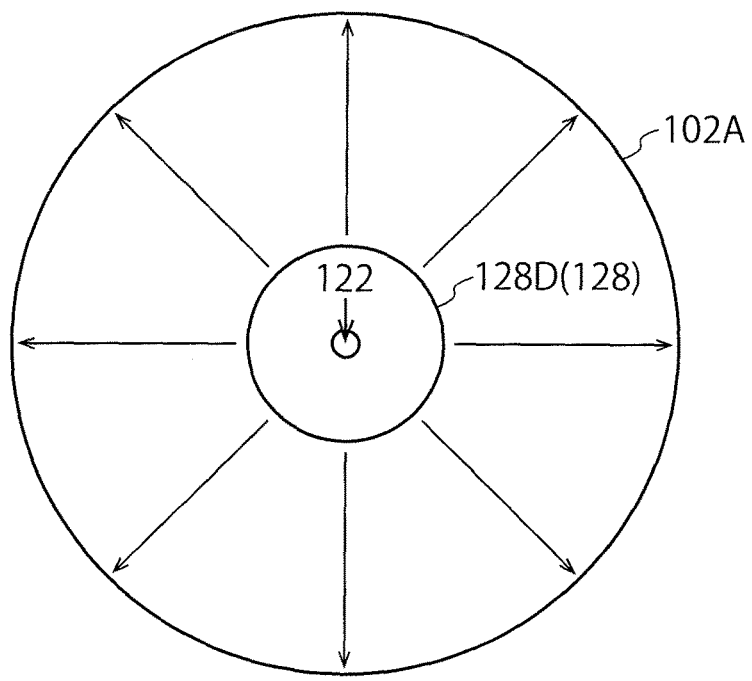
FIG. 8 is a schematic plan view showing another example of a cleaning nozzle arranged in the tank having a circular horizontal section.

In place of the aforementioned tank 102 having a rectangular parallelepiped shape, a tank 102A having a circular (or substantially circular) horizontal section, as shown in FIG. 7, for example, can be used. In this case, the cleaning nozzle 128 may be formed of one tubular body 128C that is bent into a shape along an inner circumferential surface (inner wall surface) of the tank 102A. A plurality of openings (discharge ports) (not shown in FIG. 7) are formed in the tubular body 128C, such that the openings are arrayed at intervals in the circumferential direction. The processing liquid is discharged from each discharge port radially outward in plan view (see the arrows extending from the tubular body 128C toward the inner circumferential surface of the tank 102A). Alternatively, as shown in FIG. 8, the cleaning nozzle 128 may be formed of a discoid member 128D in which a plurality of openings (discharge ports) (not shown in FIG. 7) are formed such that the openings are arrayed at intervals in the circumferential direction. The processing liquid is discharged from each discharge port radially outward in plan view (see the arrows extending from the discoid member 128D toward the inner circumferential surface of the tank 102A). In this case, the discoid member 128D forming the cleaning nozzle 128 may have a structure like a rotary sprinkler using a processing liquid to be discharged as a driving source.

Figure 9:
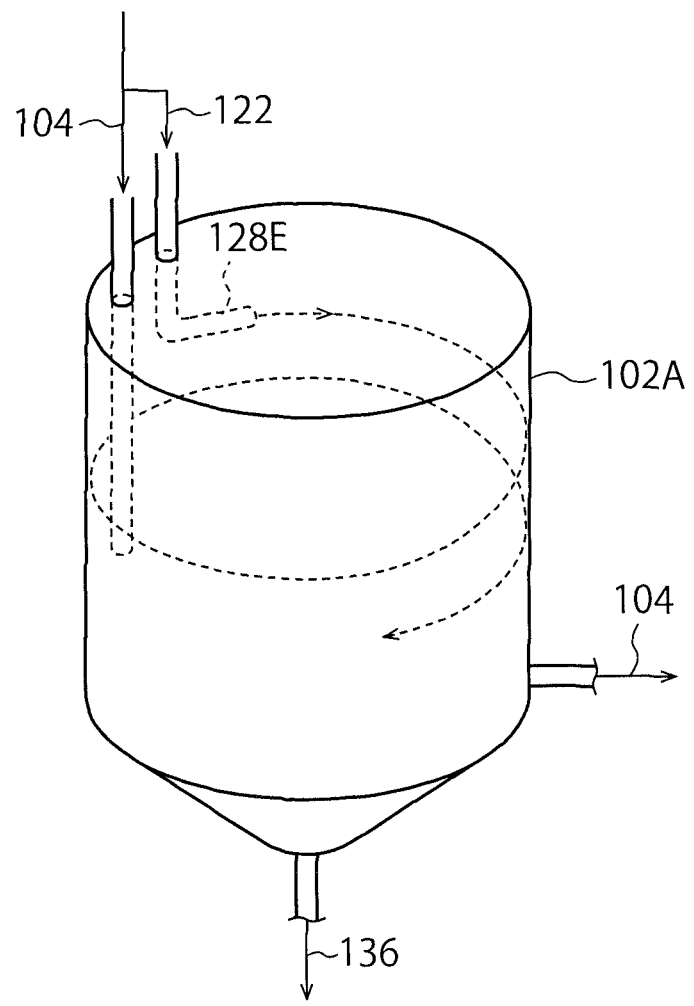
FIG. 9 is a schematic perspective view showing an example of a cylindrical tank and a cleaning nozzle arranged therein.

The tank (102A) having a circular (or substantially circular) horizontal section may have a cylindrical shape as a whole, as shown in FIG. 9. The tank 102A shown in FIG. 9 has a funnel-shaped bottom part and a cylindrical upper part. A pipe forming the drain line 136 is connected to the bottom of the funnel-shaped bottom part of the tank 102A, and a pipe forming the upstream end portion of the circulation line 104 is connected to the lowermost portion of the cylindrical upper part of the tank 102. Pipes forming the downstream end portion of the circulation line 104 and the cleaning line 122 extend vertically through the top plate of the tank 102.

A cleaning nozzle 128E is attached to a distal end of the pipe forming the cleaning line 122. The cleaning nozzle 128E ejects a cleaning liquid from a position near the inner circumferential surface (inner wall surface) of the tank, in a substantially tangential direction of the inner circumferential surface of the tank 102, and in a substantially horizontal direction or slightly downward. The cleaning liquid ejected from the cleaning nozzle 128E flows along the inner circumferential surface of the tank 102 to fall gradually downward. Namely, the cleaning liquid ejected from the cleaning nozzle 128E flows spirally along the inner circumferential surface of the tank 102. The spiral flow cleans off contaminants adhering to the inner circumferential surface of the tank 102. Also in the embodiment shown in FIG. 9, the cleaning procedure may be the same as that of the above-described embodiment. In FIG. 9, illustration of pipes forming the return line 132 and the replenishing processing liquid supply line 134B is omitted.

The tank having a circular horizontal section may be spherical as a whole. Also in this case, similarly to the embodiment of FIG. 9, a flow of the processing liquid that spirally flows along the inner circumferential surface (inner wall surface) is formed by the cleaning nozzle.

In the above-described embodiment, the substrate to be processed by the substrate processing system 1 is a semiconductor wafer. However, not limited thereto, the substrate may be a substrate of another type, e.g., an LCD glass substrate, a ceramic substrate and the like.

What is claimed is:
1. A substrate liquid treatment apparatus comprising:
a tank that stores a processing liquid;
a circulation line connected to the tank, through which circulation line a circulation flow of the processing liquid that leaves the tank and then returns back to the tank flows;
a distribution line branched from the circulation line at a first branch point for supplying processing liquid to a processing unit, wherein the processing unit processes a substrate by supplying the processing liquid, distributed from the circulation line, to the substrate via the distribution line;
a return line that returns, to the tank, the processing liquid discharged from the processing unit after being supplied to the substrate;

a cleaning nozzle that discharges a cleaning liquid onto an inner wall surface of the tank to clean the inner wall surface by the cleaning liquid;

a cleaning line that supplies the cleaning liquid to the cleaning nozzle, wherein the cleaning line is branched from the circulation line at a second branch point downstream from the first branch point, and the processing liquid stored in the tank is used as the cleaning liquid; and a constant pressure valve disposed on the circulation line at a location between the branch points for regulating the pressure in the distribution line.

2. The substrate liquid treatment apparatus according to claim 1, further comprising:

a first shutoff valve disposed on the cleaning line;

a second shutoff valve disposed on the circulation line at a location downstream of a branch point and upstream of the tank, the cleaning line being branched from the circulation line at the branch point; and a controller that controls the first and second shutoff valves such that the first shutoff valve is closed and the second shutoff valve is opened when the substrate is being processed in the processing unit, and such that the second shutoff valve is closed and the first shutoff valve is opened when the inner wall surface of the tank is being cleaned with the cleaning liquid.

3. The substrate liquid treatment apparatus according to claim 1, further comprising:

a processing liquid replenishing unit that supplies the processing liquid into the tank;

a liquid level sensor that detects a level of the processing liquid in the tank;

a controller that controls the processing liquid replenishing unit based on the level of the processing liquid in the tank detected by the liquid level sensor such that the level of the processing liquid is maintained within a range between an upper limit level and a lower limit level;

wherein the cleaning nozzle is disposed at a level higher than the upper limit level, and wherein the cleaning nozzle is arranged such that the cleaning liquid discharged from the cleaning nozzle falls on the inner wall surface at a level which is the same as or higher than the upper limit level.

4. The substrate liquid treatment apparatus according to claim 1, wherein the cleaning nozzle extends in a horizontal direction along the inner wall surface of the tank and has a plurality of discharge ports arrayed at intervals in the horizontal direction.

5. A tank cleaning method executed in a substrate liquid treatment apparatus, the substrate liquid treatment apparatus including a tank that stores a processing liquid, a circulation line connected to the tank, through which circulation line a circulation flow of the processing liquid that leaves the tank and then returns back to the tank flows, a distribution line branched from the circulation line at a first branch point for supplying processing liquid to a processing unit, wherein the processing unit processes a substrate by supplying the processing liquid, distributed from the circulation line, to the substrate via the distribution line, a return line that returns, to the tank, the processing liquid discharged from the processing unit after being supplied to the substrate, the tank cleaning method comprising:

extracting the processing liquid flowing through the circulation line at a second branch point downstream from the first branch point to a cleaning line;

discharging, as a cleaning liquid, the processing liquid from the cleaning line to a cleaning nozzle onto an inner wall surface of the tank, thereby cleaning the inner wall surface by the cleaning liquid; and regulating the pressure in the distribution line by adjusting a constant pressure valve located in the circulation line between the branch points.

6. The tank cleaning method according to claim 5, wherein the discharging of the cleaning liquid from the cleaning nozzle onto the inner wall surface of the tank is performed with the processing liquid in the tank being drained through a drain line.

7. The tank cleaning method according to claim 5, wherein the tank cleaning method is performed when the processing liquid stored in the tank is exchanged.

8. A non-transitory storage medium storing a computer program, wherein upon execution of the program by a computer for controlling operations of the substrate liquid treatment apparatus, the computer controls the substrate liquid treatment apparatus to perform the tank cleaning method according to claim 5.

\* \* \* \* \*